United States Patent [19]

McKenna et al.

[11] Patent Number: 4,556,798
[45] Date of Patent: Dec. 3, 1985

[54] FOCUSED ION BEAM COLUMN

[75] Inventors: Charles M. McKenna, Newbury Park; William M. Clark, Jr., Thousand Oaks; Robert L. Seliger, Agoura, all of Calif.

[73] Assignee: Hughes Aircraft Company, El Segundo, Calif.

[21] Appl. No.: 512,879

[22] Filed: Jul. 12, 1983

[51] Int. Cl.⁴ .................... H01J 37/30; H01J 37/317
[52] U.S. Cl. ............................ 250/492.2; 250/396 R
[58] Field of Search ............ 250/423 R, 492.3, 396 R, 250/396 ML, 492.2, 281, 492.21; 313/361.1

[56] References Cited

U.S. PATENT DOCUMENTS

| 3,723,733 | 3/1973 | Seliger et al. | 250/396 R |
| 3,937,958 | 2/1976 | Rusch et al. | 250/307 |
| 4,318,029 | 3/1982 | Jergenson et al. | 250/423 R |
| 4,367,429 | 1/1983 | Wany et al. | 250/423 R |
| 4,426,582 | 1/1984 | Orloff et al. | 250/423 R |

FOREIGN PATENT DOCUMENTS 8204351 12/1982 PCT Int'L Appl. ............ 250/492.3

OTHER PUBLICATIONS

An Asymmetric Electrostatic Lens for Field-Emission Microprobe Applications; Orloff et al., J. Appl. Phys., 50(4), Apr. 1979, pp. 2494-2501.

Primary Examiner—Alfred E. Smith
Assistant Examiner—Paul A. Guss
Attorney, Agent, or Firm—Gregory D. Ogrod; John A. Sarjeant; A. W. Karambelas

[57] ABSTRACT

Two lens focused ion beam column (10) has an accelerating lens (20) which carries a potential to focus an image of the liquid metal ion source (14) on the mass analyzer slit (26) with a magnification of about unity. Munro lens (36) accelerates the beam of selected ion species and demagnifies the image through a long working distance to provide an ion writing spot of less than about 1000 Å size.

19 Claims, 3 Drawing Figures

FOCUSED ION BEAM COLUMN

The Government of the United States of America has rights in this invention pursuant to Contract No. F19628-79-C-0181 awarded by the Department of the Air Force.

BACKGROUND OF THE INVENTION

This invention is directed to a focused ion beam column particularly useful for scanning a small spot over a large field for the exposure of resist material. The column has the capability of exposing images smaller than 0.1 micrometer (micron) and has the capability of addressing a field of about 1 millimeter square at the target while maintaining the aberration limited spot size to less than about 1,000 Å.

Previous focused ion beam columns for the exposure of resist have required that the scanfields be restricted to very small dimensions because deflection associated aberrations would cause an increase in spot size to more than 125% of the axial spot size. This limited scanfield arises from a short working distance associated with the final lens. Therefore, there is a need for a focused ion beam column wherein a small spot size can be scanned over a large field.

SUMMARY OF THE INVENTION

In order to aid in the understanding of this invention it can be stated in essentially summary form that it is directed to a two lens focused ion beam column having an ion source for producing positively charged ionic particles and an extraction electrode for extracting the positively charged ion particles to form an ion beam. A first accelerating lens focuses the desired ion species in the ion beam onto an analyzer slit. A second accelerating lens when demagnifies the beam is positioned downstream from the analyzer slit and focuses the beam of desired ion species onto a target plane. A deflector is positioned between the downstream, second lens and the target plane for deflecting the beam over a pattern on the desired plane.

It is thus a purpose and advantage of this invention to provide a focused ion beam column wherein a spot of small size can be scanned over a large scanfield for the exposure of a resist.

It is a further purpose and advantage of this invention to provide a focued ion beam column wherein the column is capable of operating in a manner for advantageous exposure of a resist, including employing ions which do not contaminate the substrate, and using ions which have a strong capability for exposure of resist. Furthermore, the ion beam column has features which permit exposing small images on large scanfields to reduce the time lost in stepping between scanfields to provide a high rate of wafer exposure. The large scanfield eliminates the time and accuracy lost due to extra reregistration.

Other purposes and advantages of this invention will become apparent from a study of the following portions of this specification, the claims and attached drawings.

DETAILED DESCRIPTION OF THE INVENTION

Figure 1:
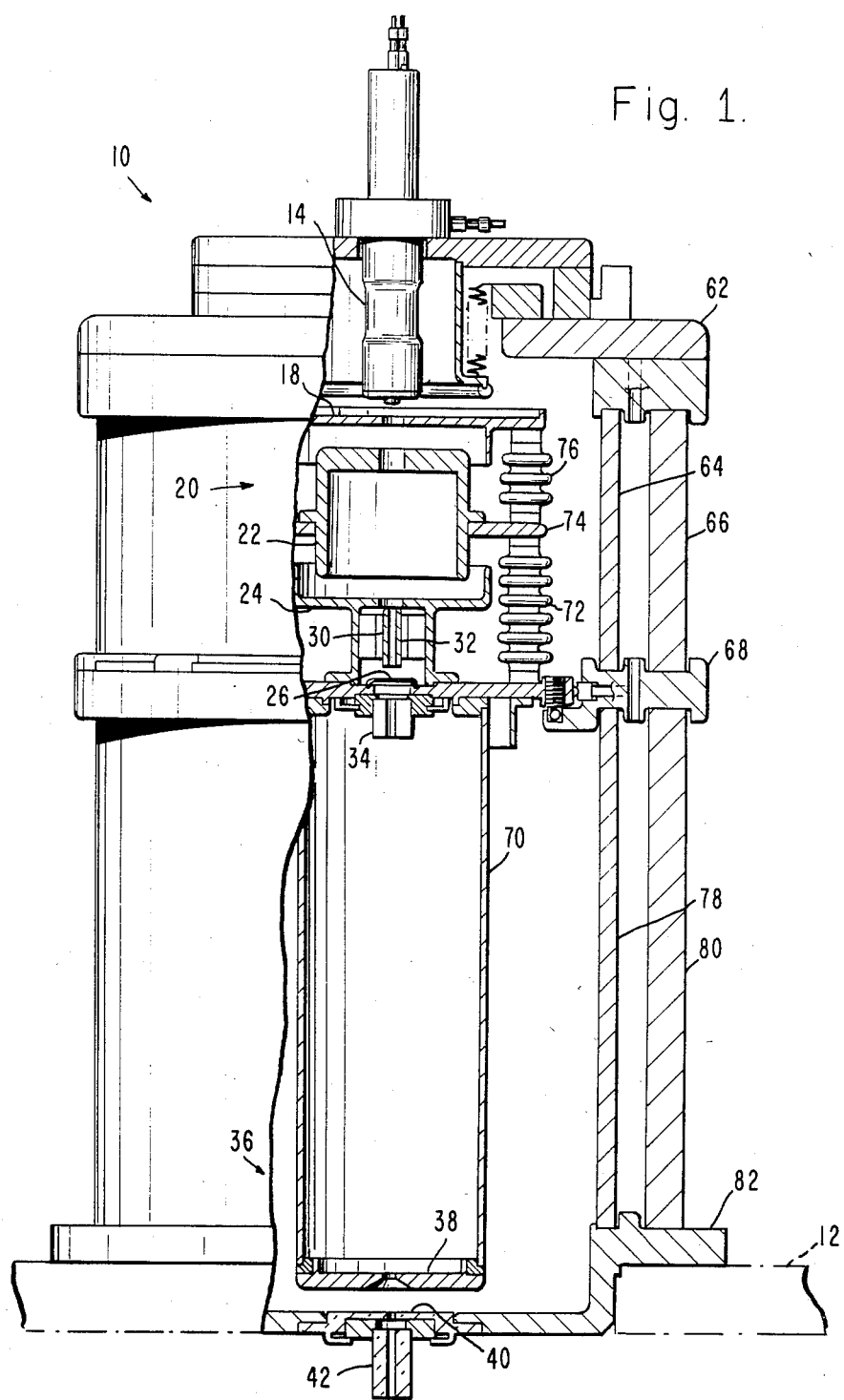
FIG. 1 is a side elevational view of a focused ion beam column in accordance with this invention, with parts broken away and parts taken in section.
Figure 2:
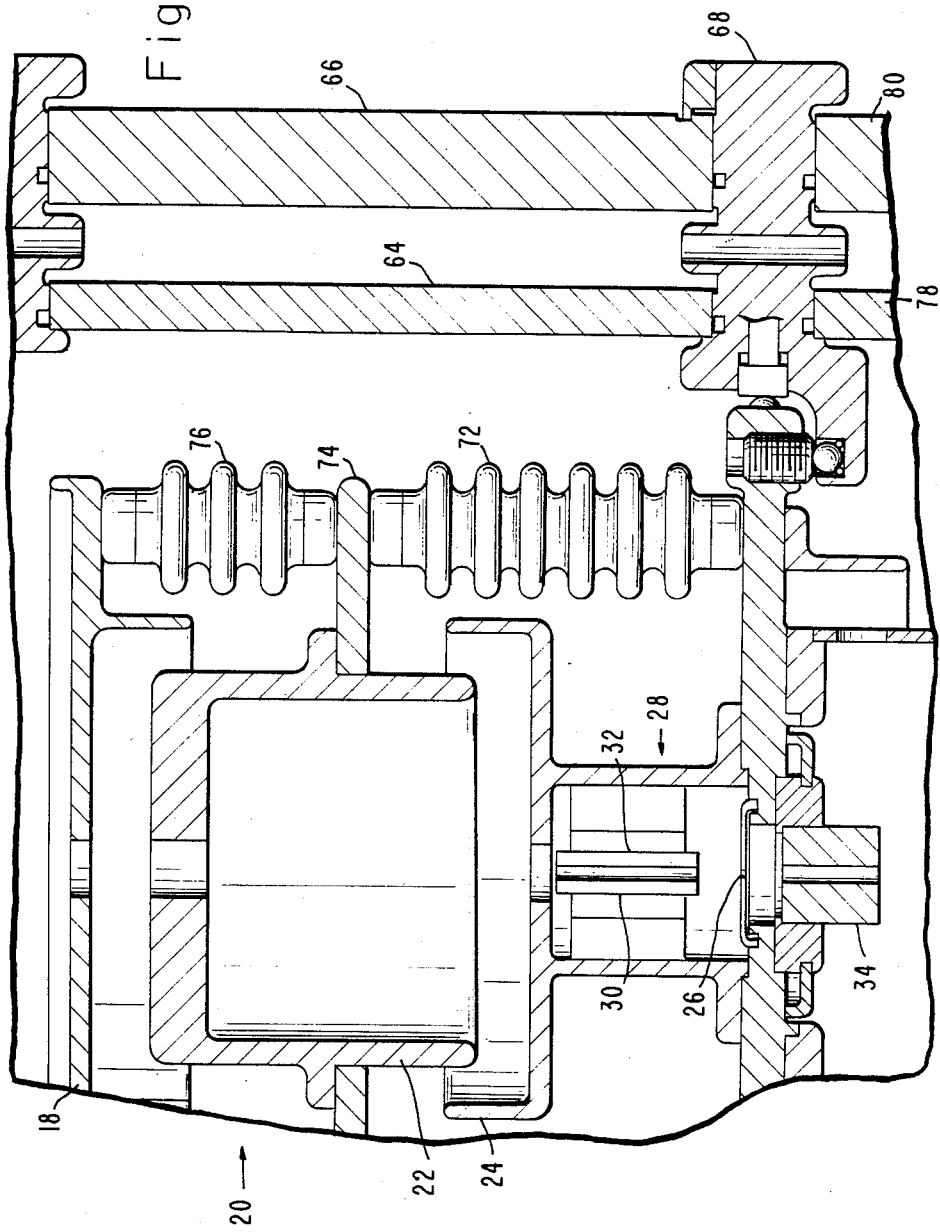
FIG. 2 is an enlarged axial section through a portion of focused ion column of FIG. 1, with parts broken away.
Figure 3:
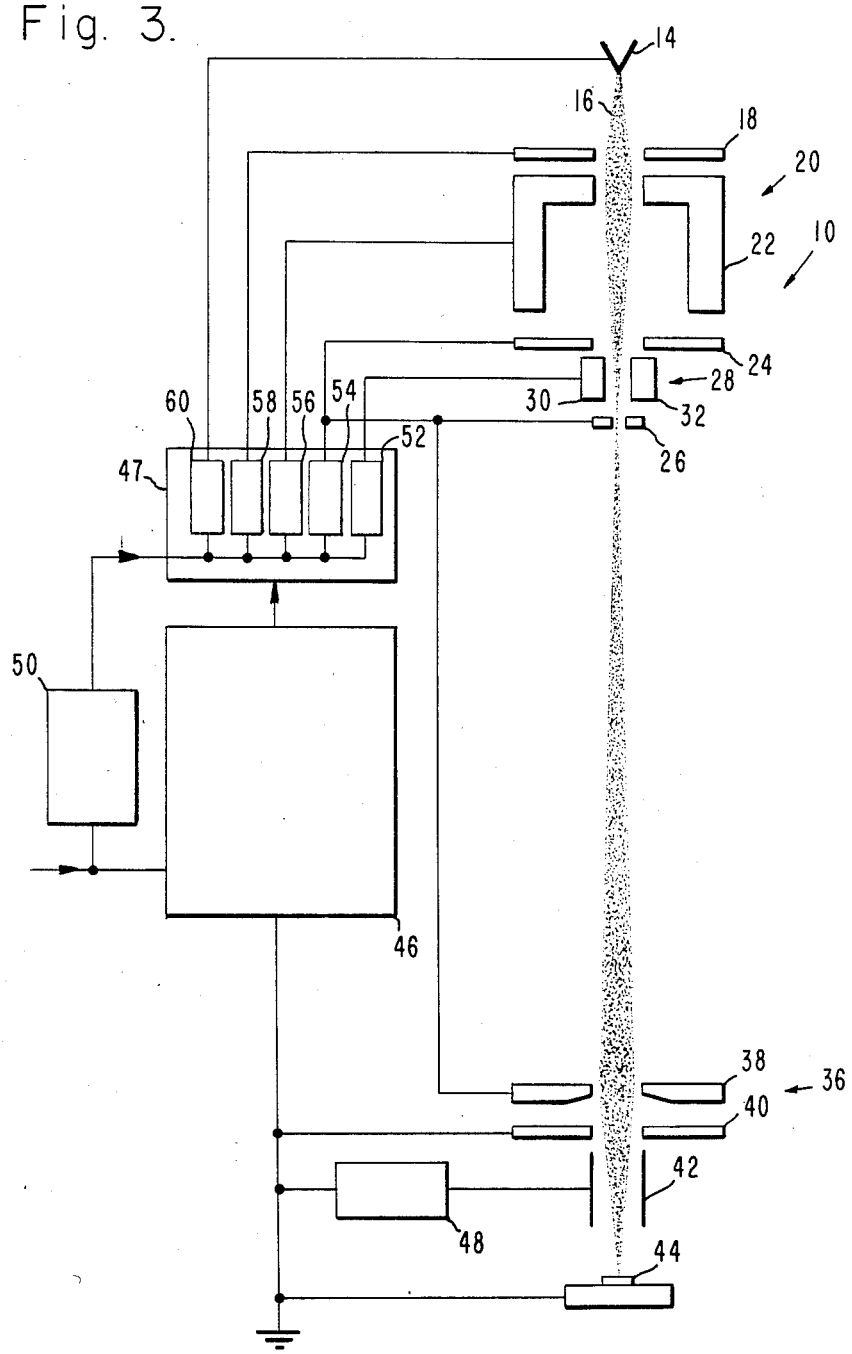
FIG. 3 is a schematic diagram of the focused ion beam column, showing also the power supply for the elements thereof.

FIG. 1 shows the ion beam column 10 of this invention as being mounted on a target chamber 12. FIG. 3 schematically illustrates the column 10 and shows its ion source 14 which produces an ion beam 16. Accelerator electrode 18 forms the first element of the three element first lens 20. The second and third elements 22 and 24 are seen in FIGS. 1, 2 and 3. In the preferred embodiment, the first lens 20 is an asymmetric lens as illustrated in FIGS. 1, 2 and 3. Asymmetric lens 20 focuses the ion beam 16 at mass analyzer slit 26. ExB mass separator 28 has its electric field plates 30 and 32 shown in FIGS. 1, 2 and 3. They lie perpendicular to the plane of the paper with their electric field gradient in the plane of the paper. Additionally supplied in a convenient manner is a magnetic field perpendicular to the plane of the paper in the space between the electric field plates. The electric and magnetic field strengths are arranged so that the desired species proceeds on a straight line along the axis of the column, as is indicated in FIG. 3. A membrane with analyzer slit 26 is positioned downstream on the axis so that the desired species passes through the slit and the undesired species is collected on the membrane around the slit. Alignment deflector 34 is positioned downstream of the slit 26 in order to maintain the beam of desired species on the axis.

Demagnifying and accelerating lens 36 is positioned downstream on the axis of the ion beam. A Munro lens is illustrated as preferred. It is the second lens in the column and comprises first and second lens elements 38 and 40. Downstream from the Munro lens 36 is deflector 42 which serves as a device to deflect the beam so that it scans the field on target 44, see FIG. 3.

The interrelationships between the operative portions of the column 10 are critical to achieve the desired capability of exposing resist layers up to 5000 Å thick. Such a resist layer thickness permits an aspect ratio of 2:1 for minimum feature sizes of 2500 Å. Such feature sizes can be achieved with ion beam lithography. Ion source 14 is a liquid metal ion source. The variety of ions available from liquid metal ion sources has recently been extended by the introduction of alloys, especially eutectic alloys of metallic elements. The liquid metal ion sources disclosed in J. B. Jergenson U.S. Pat. No. 4,318,029 and 4,318,030 can be employed as the source 14. Silicon is the preferred ion for exposure because it can be doubly charged and does not introduce impurities in the silicon target under the resist being exposed. The doubly charged silicon ion beam can be produced from an 80%/20% gold/silicon eutectic. The ion beam 16 is extracted from the source by means of extraction electrode 18 which serves as the first element of asymmetric lens 20.

The variation in the potential at which the silicon ions are created in the liquid metal cusp in the source represents the dominant factor in determining the minimum achievable spot size at the target. This potential variation or chromatic spread arises from the large potential gradients at the liquid metal cusp and has been characterized to be between 6 and 14 volts, with 10 volts being typical.

The asymmetric lens 20 is used to image the emitting tip of the liquid metal source 14 at the separation slit 26. This decouples the beam properties at the slit 26 from variations in the extraction voltage. Asymmetric lens 20 operates at a voltage ratio of about 4 to produce an acceleration potential of 40 kilovolts prior to mass separation. The lens shape and spacing is such that with this potential the lens magnification is very near unity so that an aberration limited spot size of less than about 5000 Å is achieved at the focus point of lens 20 at the separation slit 26.

The ExB mass separator 28 separates the doubly charged silicon ions from the other ionic species in the beam. This type of device has the advantage of alignment on the optical axis and is of simple design. The electric and magnetic fields are as weak as possible to completely resolve doubly charged silicon from the nearest lying beam component which is singly charged silicon. The mass 29 and mass 30 isotopes of silicon are discriminated against by using the exposure characteristics of the photoresist on the target and also by isotopically enriching the silicon source to at least 99% silicon 28. The chromatic aberration introduced by the ExB fields under these conditions are less than 400 Å at the mass separation slit 26 and this aberration is negligible compared to the contributions from the asymmetric lens 20.

The final beam focusing is performed by the accelerating and demagnifying Munro lens 36, operating at a voltage ratio of 4 to 1. The lens spacing and shape is such that magnification under these conditions is 0.161, such that the overall system magnification is less than about 0.17. This minimizes the effect on spot size which results from the finite source size. The aberration limited beam spot size, when the beam is on axis at the target, for this combination of lenses, is about 700 Å for typical source operation, when the chromatic spread of the source is 10 volts and is about 983 Å when chromatic spread is 14 volts, the worst case.

With about unity magnification in the first lens 20, lens demagnification is required in the second lens 36, so that there is a large working distance between the second lens element 40 of Munro lens 36 and the target. Also, the small beam divergence $\alpha_2$ out of the first lens allows a long drift region between lenses. The long working distance out of the second lens permits the use of a long deflector 42 to achieve significant scanfield size up to about 1 millimeter square, while maintaining relatively small deflection angles, below 10 milliradians and with reasonable deflection voltages, for example less than 150 volts. These factors are critical in reducing scan related aberrations from field curvature, astigmatism and distortion. By dividing the acceleration about equally between the two lenses, aberration in the ExB filter and second lens is minimized. The aberrations shown in Table I are calculated for 14 volt levels of chromatic spread in the beam. Table II shows that spot sizes are less than about 1200 Å over the complete field for worst case operation of the ion source at a 14 volt chromatic spread. The calculations also indicate that a field of 1 millimeter square can be addressed with only a 25% spot size increase for worst case conditions. The spot size would be less than about 1000 Å for the nominal 10 volt chromatic spread over the entire field.

Table I describes a particular example of an embodiment of this invention. The figures are for a worst case chromatic aberration of 14 volts. The beam diameter total is the on-axis beam. Note that lens 1 has a magnification near unity.

TABLE I

| LENS 1 | |
|---|---|
| Spherical Aberration Coefficient | $C_s^o = 993.1$ mm |
| Chromatic Aberration Coefficient | $C_c^o = 310.1$ mm |
| Object Distance | $Z_o = -47.5$ mm |
| Image Distance | $Z_i = 162.0$ mm |
| Magnification | $M_1 = 1.047$ |
| Aberrated Spot Size in Object Plane of First Lens | $d_1 = 4341$ Å |
| | $M_1 d_1 = 4545$ Å |

E × B $$d' = \alpha \frac{V_2}{V'_2}\left[1 - \left(\frac{V'_2}{V_2}\right)^{\frac{1}{2}}\right]\left(\frac{L}{2} + L'\right)$$

$L = 3$ cm; $L' = 1.5$ cm; $\alpha = 7.5$ mrad

| LENS 2 | |
|---|---|
| | $C_s^i = 8658.15$ mm |
| | $C_c^i = 491.24$ mm |
| | $Z_o = -410.0$ mm |
| | $Z_i = 90.72$ mm |
| Beam Half Angle Exiting Lens 2 | $\alpha_3 = 1.483$ mrad |
| | $M_2 = 0.161$ |
| Spherically Aberrated Spot Size | $d_{s2} = 141$ Å |
| Chromatically Aberrated Spot Size | $d_{c2} = 637.5$ Å |

| TOTAL | |
|---|---|
| Aberration Due to Lens 2 | $d_2 = 652.9$ Å |
| Aberration from Lens 1 as Seen at Target | $M_2 M_1 d_1 = 731.8$ Å |
| Aberration Due to E × B as Seen at Target | $M_2 d'_{E \times B} = 63.4$ Å |

$$d_{total} = \sqrt{d_2^2 + \ldots}$$

$$d_{total} = 982.7 \text{ Å}$$

Table II gives an example of a desired scanfield and the aberration that results from that scanfield.

TABLE II

| SCANFIELD CRITERIA | |
|---|---|
| Scanfield ($D_y$) | $- \pm 500 \mu m \times \sqrt{2}$ |
| Working Distance from Final Lens | $- 7.6$ cm |
| Scan Plate Entrance to Target (L) | $- 7.1$ cm |
| Scan Plate Length (l) | $- 5.0$ cm |
| Beam Radius at Entrance ($R_A$) | $= 120 \mu m$ |

| SCANFIELD ABERRATIONS | |
|---|---|
| Curvature/Astigmatism | $\simeq \dfrac{2D_y^2 R_A}{lL} = 337$ Å |
| Distortion | $= \dfrac{L_y}{BL^2\left(1 - \dfrac{1}{2L}\right)^3} = 227$ Å |
| Chromatic | $= D_y \dfrac{\Delta V}{V_o} = 619$ Å $(\Delta V = 14V)$ |

| OFF-AXIS BEAM SPOT SIZE |
|---|
| $d_{spot}^2 = (982.7)^2 + (337)^2 + (227)^2 + (619)^2$ |
| $d_{spot} = 1230$ Å |
| $\Delta d/d_{axis} = 25.2\%$ |

FIG. 3 shows the power supplies which provide the various potentials shown in Table III. The principal high voltage power supply 46 provides 120 KV potential to the floating frame 47 on which power supplies 52–60 are mounted and are referenced. Power to the supplies is provided through isolation transformer 50.

Deflection power supply 48 provides the differential voltages necessary for beam deflection.

Individual power supplies 52, 54, 56, and 60 respectively supply the potentials to the E-plates of separator 28, lens elements 22, 24, 38 and acceleration electrode 18 of asymmetric lens 20. Note that the 4 to 1 voltge ratio on both lenses divides the beam acceleration equally between the lenses. Power supply 60 provides the cathode voltage and heater supply potential to ion source 14.

TABLE III

| Potential Between Elements | |
|---|---|
| Ion source 14 to extraction electrode 18 | 6–10 KV |
| Extraction electrode 18 to second element 22 of asymmetric lens 20 | 5–7 KV |
| Second element 22 to third element 24 and to first element 38 of Munro lens 36 | 39–35 KV |
| First element 38 to second element 40 and target 44 | 120 KV |
| Total beam potential | 160 KV |

FIGS. 1 and 2 show the physical column structure by which the portions of the column system are held in alignment. As seen in FIG. 1, ion source 14 is mounted on column cap 62. The lower edge of the cap carries annular grooves in which are fitted insulator tubes 64 and 66. Center plate 68 carries drift tube 70 thereunder, which at its lower end carries the first lens element 38 of Munro lens 36. Center plate 68 is at the potential of lens element 38. The analyzer plate carrying mass analyzer slit 26 is also mounted on center plate 68 and is at the potential of lens element 38. Similarly, the third element 24 of asymmetric lens 20 and the ExB mass separator 28 are mounted on the center plate to lie at the same potential. Of course, ExB mass separator 28 has its field plates floating with respect to that potential to apply a transverse electric field.

Insulators 72 carry support ring 74 which in turn carries therethrough the inverted cup-shaped second element 22 of asymmetric lens 20. Insulators 76 are mounted on the top of support ring 74 and carry thereon the accelerator electrode 18. Insulator tubes 78 and 80 are engaged between center plate 68 and the base ring 82, which in turn mounts on target chamber 12. These structures maintain physical alignment, vacuum integrity and electrical isolation of the various parts of the ion beam column.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A two lens focused ion beam column capable of scanning an approximately 1 mm. square field with an aberration limited spot having a diameter no more than about 0.1 μm, comprising:

an ion source for producing positively charged ionic particles including a desired ion species;

an extraction electrode for extracting positively charged ion particles from the ion source to form an ion beam;

a mass separator including an analyzer slit;

a first lens positioned between said extraction electrode and said analyzer slit for focusing the desired species of ion in the ion beam onto said analyzer slit with a spot size of less than about 0.5 μm, said first lens being configured to be an accelerating lens which increases the beam energy and has a magnification of about unity;

a second lens downstream from said analyzer slot for focusing the beam of desired ion species to a spot having a diameter of no more than about 0.1 μm on a target plane on a target mounting means, said second lens being configured to be an accelerating and demagnifying lens which increases the beam energy;

an elongate deflector positioned between said second lens and said target plane for deflecting the beam over a pattern within a scanfield on the desired plane, the working distance between the second lens and the target plane being long enough for the deflector to scan the beam over an approximately 1 mm. square field with deflection angles of no greater than about 10 mrad., whereby aberration-induced increases in spot size at the target plane are limited to no more than about 25%; and power supply means connected to said source, said extraction electrode, said first lens, said second lens and said target mounting means for increasing the energy of the beam through said first and second lenses at substantially equal voltage ratios, for focusing the ion beam through said first lens with near unity magnification so that a substantially unmagnified, aberration limited image of said source appears at said mass analyzer slit, and for focusing the ion beam through said second lens with demagnification sufficient to focus the beam to a spot on the target plane.

2. The focused ion beam column of claim 1 wherein said source is a liquid metal ion source of doubly charged silicon ions.

3. The focused ion beam column of claim 2 wherein said liquid metal ion source carries an alloy which includes an element which is ionized at said liquid metal ion source to become the desired species.

4. The focused ion beam column of claim 1 wherein said first lens is a asymmetric lens and said extraction electrode serves as the first element of said asymmetric lens.

5. The focused ion beam column of claim 4 wherein said source is a liquid metal ion source of doubly charged silicon ions.

6. The focused ion beam column of claim 5 wherein said liquid metal ion source carries a gold/silicon alloy wherein silicon is doubly ionized at said liquid metal ion source to become the desired species.

7. The focused ion beam column of claim 1 wherein said power supply means operates said first lens so that said first lens operates at a magnification near unity.

8. The focused ion beam column of claim 1, the mass separator comprising an ExB mass analyzer, wherein the physical geometry and electrical potentials of the electrodes of said first and second lenses and the deflector are chosen such that their chromatic aberrations due to the energy spread in the beam are greater than the aberrations due to deflection field spherical curvature at the target plane or chromatic aberrations caused by the ExB mass analyzer.

9. The focused ion beam column of claim 1 wherein said column has a central axis which extends in a straight line from said source and through the center of said first lens, said mass analyzer slit and said second lens, and said mass analyzer is operated with a magnetiic and electric field strength such that the desired ion species travels substantially along said axis and ions of other species or charges are deflected too not pass through said analyzer slit.

10. A two lens focused ion beam column comprising:
   a liquid metal source having an emitting tip which is less than about 0.5 μm in size for producing doubly positively charged silicon ions;
   an extraction electrode for extracting doubly charged silicon ions from the source to form an ion beam;
   a mass separator including an analyzer slit;
   an asymmetric accelerating lens of magnification near unity positioned between said extraction electrode and said analyzer slit for focusing the doubly charged silicon ions in the ion beam onto said analyzer slit with a spot size of less than about 0.5 μm;
   an accelerating and demagnifying Munro lens downstream from said analyzer slit for focusing the beam of double charged silicon ions to a spot having a diameter of no more than about 0.1 μm on a target plane on a target mounting means;
   an elongate deflector positioned between said Munro lens and said target plane for deflecting the beam of doubly charged silicon ions over a pattern within a scanfield on the desired plane, the working distance between the Munro lens and the target plane being long enough for tthe deflector to scan the beam over an approximately 1 mm. square field with deflection angles of no greater than about 10 mrads., whereby aberration-induced increases in spot size at the target plane are limited to no more than about 25%; and
   power supply means connected to said source, said extraction electrode, said first lens, said Munro lens and said target mounting means for increasing the energy of the beam through both said lenses at substantially equal voltage ratios, for focusing the ion beam through said asymmetric lens with near unity magnification so that a substantially unmagnified, aberration limited image of said source appears at said mass analyzer slit, and for focusing the ion beam through said Munro lens with demagnification sufficient to focus the beam to a spot on the target plane.

11. The focused ion beam column of claim 10 wherein said liquid metal ion source carries a gold/silicon alloy which produces doubly charged silicon ions to become the desired species.

12. The focused ion beam column of claim 10 wherein the physical positioning and the fields applied to said mass separator are sufficient to separate singly charged silicon ions from the beam.

13. The focused ion beam column of claim 10 wherein the distance from said Munro lens to said target plane is at least 5 cm.

14. The focused ion beam column of claim 10 wherein the scanfield size is at least 1 mm across.

15. The focused ion beam column of claim 1 wherein the second lens demagnifies the beam by a factor of about 0.17.

16. The focused ion beam column of claim 1 wherein the working distance between the second lens and the target plane is at least about 5 cm.

17. The focused ion beam column of claim 16 wherein the elongate deflector extends for at least about 3 cm. between the second lens and the target plane.

18. The focused ion beam column of claim 16 wherein the working distance between the second lens and the target plane is about 7–8 cm.

19. The focused ion beam column of claim 16 wherein the elongated deflector extends for about 5 cm. between the second lens and the target plane.

* * * * *